United States Patent [19]
Chickanosky, Jr. et al.

[11] Patent Number: 5,157,352
[45] Date of Patent: Oct. 20, 1992

[54] BIAS CURRENT CONTROL FOR OPERATIONAL AMPLIFIER CURRENT/VOLTAGE CONVERTERS

[75] Inventors: David P. Chickanosky, Jr., Ashburn, Va.; Joe T. May, Leesburg, Va.

[73] Assignee: Electronic Instrumentation and Technology Inc., Sterling, Va.

[21] Appl. No.: 787,568

[22] Filed: Nov. 4, 1991

[51] Int. Cl.$^5$ ............................................... H03F 1/30
[52] U.S. Cl. ........................................ 330/289; 357/87; 307/310
[58] Field of Search ............... 330/256, 289; 357/87; 307/310; 361/381, 386, 388

[56] References Cited

U.S. PATENT DOCUMENTS

| | | | |
|---|---|---|---|
| 2,930,904 | 3/1960 | Fritts | 357/87 X |
| 4,370,615 | 1/1983 | Whistler et al. | 324/441 X |
| 4,685,081 | 8/1987 | Richman | 365/1 |
| 4,689,659 | 8/1987 | Watanabe | 357/81 |
| 4,727,554 | 2/1988 | Watanabe | 372/36 |
| 4,883,957 | 1/1989 | Kinge et al. | 250/281 X |
| 4,935,864 | 6/1990 | Schmidt et al. | 363/141 |

*Primary Examiner*—James B. Mullins
*Attorney, Agent, or Firm*—Whitham & Marhoefer

[57] ABSTRACT

A Peltier cooling system for solid-state operational amplifiers reduces the bias current and allows the amplifier to perform at a level previously attained only by vacuum tube operational amplifiers. The amplifier is cooled with a Peltier junction substantially below the ambient to control the temperature very closely to a fixed value. A solid-state temperature detector is placed in thermal contact with the operational amplifier substrate. The sensor output, which is proportional to he absolute temperature of the operational amplifier, is fed to the temperature control circuitry. The control circuitry compares the sensor current with a temperature set point current, and the difference is used to control the cooler current.

9 Claims, 4 Drawing Sheets

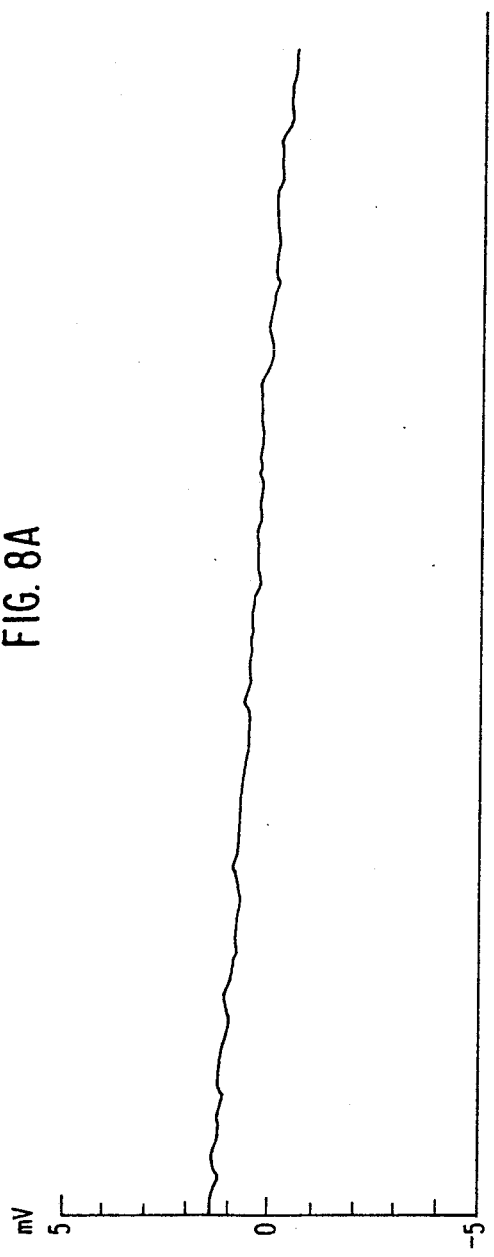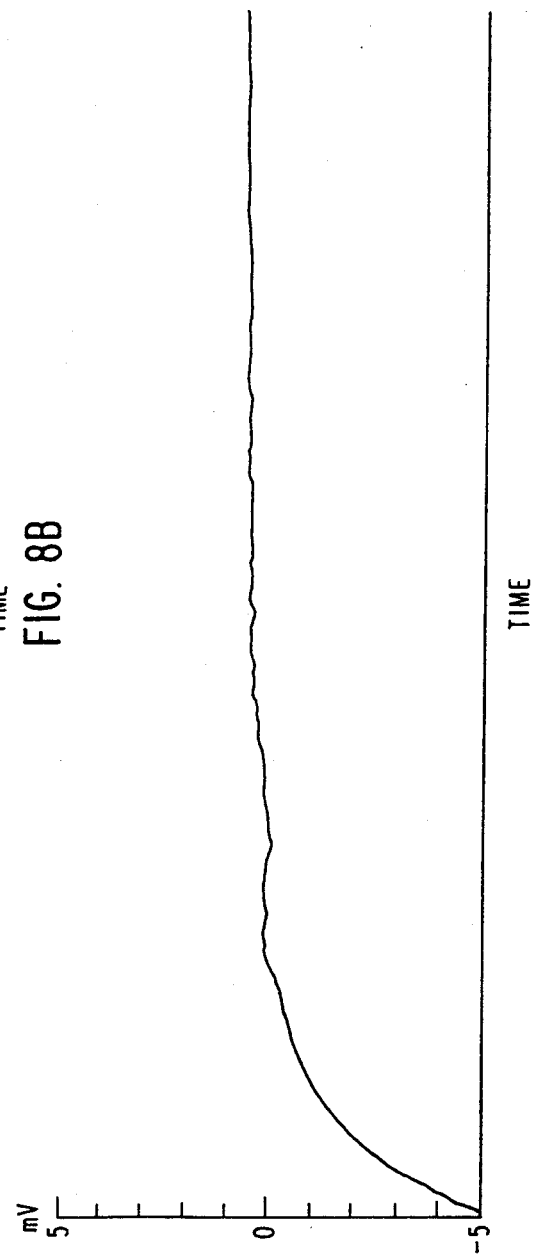

BIAS CURRENT CONTROL FOR OPERATIONAL AMPLIFIER CURRENT/VOLTAGE CONVERTERS

BACKGROUND OF THE INVENTION

1. Field of the Invention

The present invention generally relates to operational amplifier current/voltage converters for instrumentation applications and, more particularly, a bias current control for solid-state amplifiers which allows the accurate measurement of very small currents.

2. Description of the Prior Art

The invention arose out of a specific application; that of a helium detector used to detect very small leaks in certain scientific equipment. The helium detector in this particular case was used to test the integrity of a linear accelerator. The interior of the accelerator was evacuated by a vacuum pump and helium was introduced to the exterior of the accelerator. A helium detector placed in the interior of the accelerator detected minute quantities, as low as $2 \times 10^{-10}$ (ATM)(cc)/sec., of helium producing currents in the range of 5 to 25 femtoamperes (fA or $10^{-15}$ Ampere)

While the invention arose out of the specific application of vacuum ion gage measurement, the invention has other applications where the measurement of minute currents is required. For example, electrometer amplifiers, photodiode pre-amplifiers and mass spectrometers are other such applications that require the measurement of extremely low currents.

The measurement of current is typically performed by converting the current to a voltage which is then easily measured. One way to do this is to use an operational amplifier which is characterized by a very high output impedance. For currents in the range of 5 to 10 fA, vacuum tube amplifiers have been used because solid-state amplifiers typically cannot make accurate measurements in this range due to drift. The problem with vacuum tube amplifiers, however, is that they tend to deteriorate over time and they consume larger amounts of power.

Solid-state amplifiers have been investigated for small current measurement applications, and it has been found that the bias current can be significantly reduced by lowering the operating temperature of the amplifier. For example, as shown in the data sheets for a junction field effect transistor (JFET) input operational amplifier manufactured and sold by Analog Devices, part number AD549LH, bias current increases by a factor of 2.3 for every 10° C. rise in temperature. Equation (1) predicts the value of bias current for a given temperature.

$$I_B = 5e^{-22.70(1 - T/273)} fA (10^{-15} \text{ Amperes}) \quad (1)$$

Equation (2) describes the change in bias current with small changes in temperature.

$$dI_B = 0.416 e^{-22.70(1 - T/273)} fA (10^{-15} \text{ Amperes}) \quad (2)$$

Typical values of bias currents, $I_B$, are 7.6fA at 5° C., 40fA at 25° C. and 319.6fA at 50° C. Note that the absolute values are much reduced at lower temperature. Typical changes in bias current, $dI_B$, per degree centigrade at various temperatures are 0.6fA/° C. at 5° C., 3.3fA/° C. at 25° C. and 26.6fA/° C. at 50° C.

The practical significance of this data is that if bias current is reduced by lowering the amplifier's temperature, nulling of the current becomes much easier because temperature does not have to be controlled so tightly. For example, if bias current is to be nulled to within ±1 fA, then temperature must be controlled as follows:

At 5° C., temperature needs to be controlled to ±1° C. for ±1 fA.

At 50° C., temperature needs to be controlled to ±0.038° C. for ±1 fA. Temperature control to ±1° C. is not nearly so difficult as control to ±0.038° C.

U.S. Pat No. 4,689,659 and No. 4,727,554 to Watanabe disclose temperature controllers for semiconductor devices. The approach taken by Watanabe in patent No. 4,727,554 is to mount the semiconductor device or devices on a heat sink. A Peltier cooling device is mounted to the heat sink on one side and to a heat radiating fin on the opposite side. A temperature sensor is also mounted to the heat sink. The temperature sensor generates an output current proportional to the temperature of the heat sink, and this output current is input to temperature controlling feedback circuit which controls the current to the Peltier cooling devices. In patent No. 4,689,659, Watanabe takes a similar approach except that the heat sink is replaced by a thermal insulation and the temperature sensor is mounted on the outside of the package can for the semiconductor device.

Peltier junction devices are, of course, well known in the art of cooling various electronic devices. Another example is shown in U.S. Pat. No. 4,685,081 to Richman wherein a Peltier junction device is used for thermal control of solid-state devices and, in particular, bubble memories which have a narrow temperature band of operation. In the Richman circuit, the Peltier junction is used to both heat and cool the bubble memory.

The problem of cooling the operational amplifier current to voltage converter for the helium current detector was originally addressed similarly to the temperature control used by Watanabe. The temperature control circuit controlled the temperature of the heat sink very well for this approach, measured within tolerance for controlling the amplifier's bias current. However, amplifier drift remained a problem for the very small currents which needed to be measured. This was not recognized in the prior art as represented, for example, by Watanabe, perhaps because the prior art had not attempted to measure such small currents with solid-state amplifiers. The reason for the drift was not apparent, but the fact that it persisted in spite of the cooling which was applied suggested that perhaps only vacuum tube amplifiers could, as a practical matter, be used to measure these small currents. Yet, for the particular application, a vacuum tube amplifier simply could not be used owing to the design of the apparatus.

SUMMARY OF THE INVENTION

It is therefore an object of the present invention to provide a bias current control for a solid-state operational amplifier which makes possible accurate measurements of very small currents.

In investigating the problem, the inventor discovered a temperature gradient between the semiconductor substrate and the heatsink, to which the Peltier junction was conventionally attached in the prior art. The temperature gradient was found by attaching temperature sensor to the ceramic substrate of the semiconductor package. The ceramic substrate supports the die within the package and has less thermal resistance to the temperature sensitive area of the semiconductor substrate. This temperature gradient was quite unexpected since the thermal conductivity of the heatsink is designed to be quite high to efficiently radiate the heat generated by the semiconductor device.

It is therefore another object of the invention to provide a more accurate sample of the semiconductor amplifier's operating temperature so as to regulate the temperature of the amplifier's bias current to ±1 fA.

According to the invention, there is provided a Peltier cooling system for solid-state operational amplifiers which reduces the bias current and allows the amplifier to perform at a level previously attained only by vacuum tube operational amplifiers. This is accomplished by cooling the amplifier, with a Peltier junction, substantially below the ambient and controlling the temperature very closely to a fixed value. A solid-state temperature detector is placed in contact with the operational amplifier substrate. The sensor output, which is proportional to the absolute temperature of the operational amplifier, is fed to feedback control circuitry. The control circuitry compares the sensor current with a temperature set point current, and the difference is used to control the cooler current. By this means the operational amplifier is held very close to a selected temperature and the bias current is controlled to a specific value which is easy to null.

The invention resides in the discovery that there is a thermal gradient between the heat sink and the amplifier substrate. This unexpected thermal gradient has in the past been negligible for most applications; however, it prevented the tight control of temperature required for the critical applications of very low current measurement to which the subject invention is directed. The thermal gradient problem has been overcome by placing the current sensor in direct thermal contact with the solid-state amplifier substrate. In a preferred embodiment of the invention using a commercially available operational amplifier, this is accomplished by attaching the temperature sensor with an epoxy resin having good thermal conductivity directly to the ceramic bead on which the substrate is mounted. Access to the ceramic bead is at the bottom of the can in which the solid-state operational amplifier is packaged. Alternatively, for even better temperature sensing, the solid-state temperature sensor is manufactured on the same substrate as the operational amplifier.

BRIEF DESCRIPTION OF THE DRAWINGS

The foregoing and other objects, advantages will be better understood from the following detailed description of a preferred embodiment of the invention with reference to the drawings, in which:

FIGS. 8A and 8B are graphs respectively showing the drift of the amplifier without and with the temperature control according to the present invention.

DETAILED DESCRIPTION OF A PREFERRED EMBODIMENT OF THE INVENTION

Figure 1:
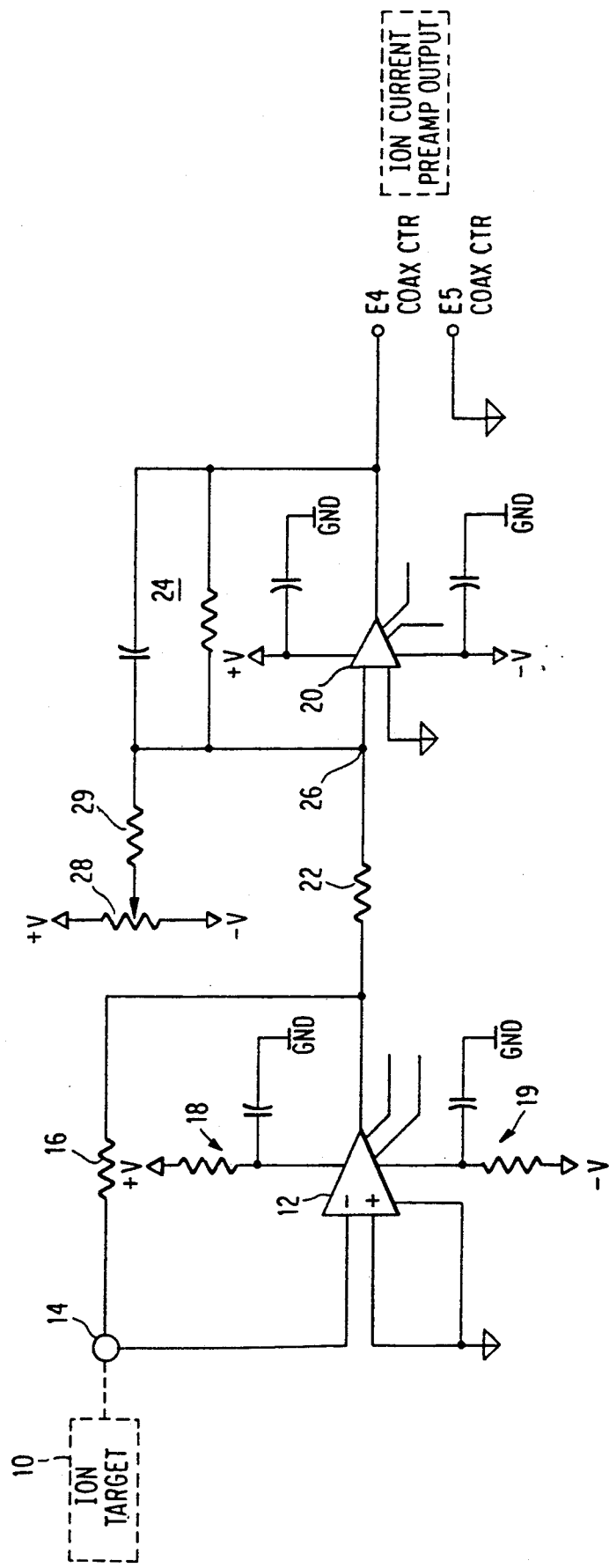
FIG. 1 is a schematic diagram of an ion current to voltage converter preamplifier used in a preferred embodiment of the invention.

Referring now to the drawings, and more particularly to FIG. 1, there is shown an ion current to voltage converter circuit. The ion target 10 of a helium detector is connected to the inverting input of an operational amplifier 12 via terminal 14 which serves as a summing junction. The non-inverting input is connected to circuit ground. A precision feedback resistor 16 is connected between the output of the amplifier 12 and the terminal 14. Well regulated positive and negative power is supplied via low pass filters 18 and 19, respectively, to the amplifier 12. The amplifier 12 is a commercially available amplifier, model AD549LH manufactured by Analog Devices.

The operational amplifier 12 is characterized by very high output impedance and serves to convert the ion current from the target 10 to an output voltage. This output voltage is connected to the inverting input of a second operational amplifier 20 via a coupling resistor 22. The non-inverting input to amplifier 20 is connected to circuit ground. The amplifier 20 has a parallel RC feedback circuit 24 connected between its output and a summing junction 26 at its inverting input. Also connected to the summing junction 26 is an adjustable bias circuit, comprising a potentiometer 28 and resistor 29, to offset the voltage generated by the bias current in the first stage.

The amplifier 12 is available in a conventional package. This package typically comprises a ceramic bead through which a plurality of electrical leads pass and on which the silicon substrate of the operational amplifier integrated circuit is mounted. Fine wire electrical connections are made from header ends of the electrical leads, and the ceramic bead with the integrated circuit is enclosed in a metal hat for protection.

Figure 2:
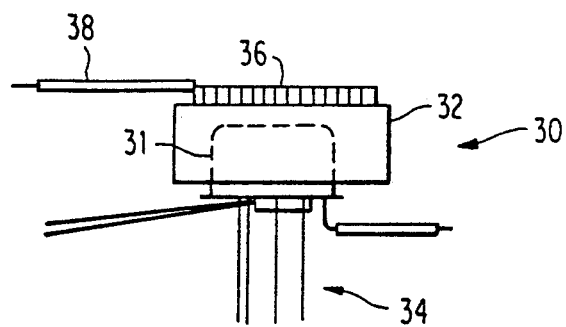
FIG. 2 is a side view of the subassembly of the current/voltage converter shown in FIG. 1 with a cooling block and Peltier junction device.

FIG. 2 shows a side view of the subassembly 30 incorporating this amplifier package. The metal hat 31 (shown partially in dotted line) fits into a recess in a heat sink 32 with the electrical leads 34 projecting outwardly from the heat sink. A Peltier junction device 36 is mounted to the face of the heat sink opposite the recess with its cold side against the face heat sink. This is conveniently accomplished with an epoxy resin exhibiting good thermal conductivity. The Peltier junction device 36 has electrical leads 38 which project parallel to the face of the heat sink to which the device is attached.

Figure 3:
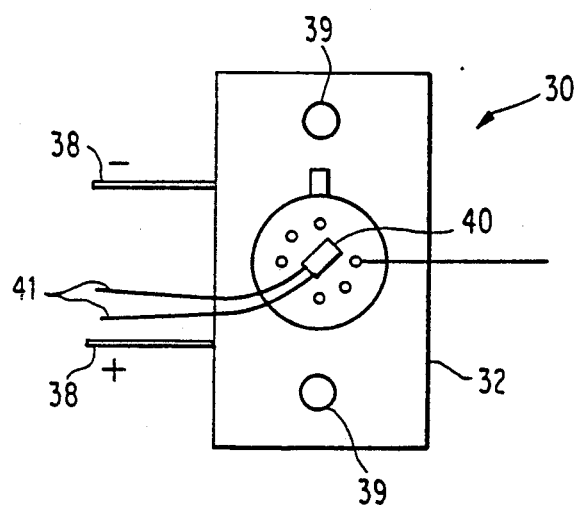
FIG. 3 is a bottom view of the subassembly shown in FIG. 2 showing the placement of the temperature sensor.
Figure 4A:
FIGS. 4A and 4B are, respectively, a side view and a top view of the temperature sensor used in a preferred embodiment of the invention.
Figure 4B:
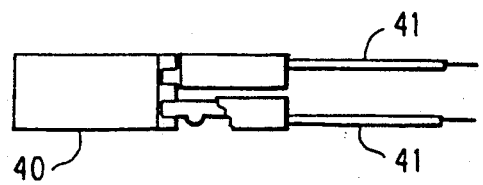

FIG. 3 is a bottom view of the subassembly, and it will be noted that the heat sink 32 has a pair of mounting holes 39 which are for the purpose of facilitating the final assembly. Visible in the bottom view is the solid-state temperature sensor 40 which is attached to the center of the ceramic bead through which the electrical leads 34 pass. The temperature sensor is attached with an epoxy resin having good thermal conduction characteristics. The temperature sensor 40 is provided with electrical leads 41 which extend generally parallel to the electrical leads 38 of the Peltier junction device 36. FIGS. 4A and 4B show enlarged top and side views, respectively, of the temperature sensor 40. The temperature sensor is a commercially available device manufactured by Analog Devices, part number AD590JF.

Figure 5:
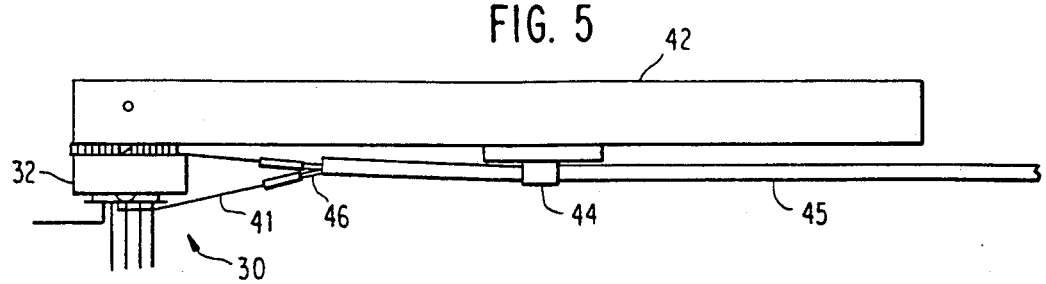
FIG. 5 is a side view of the mechanical assembly including the subassembly of FIGS. 2 and 3 for the current/voltage converter.
Figure 6:
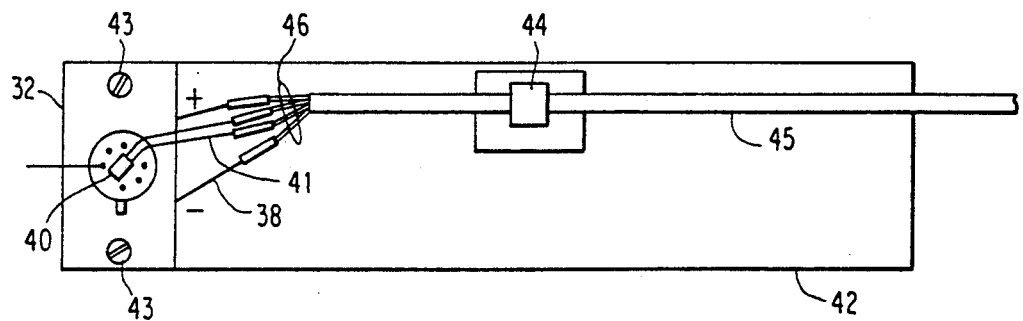
FIG. 6 is a bottom view of the mechanical assembly shown in FIG. 5.

The subassembly 30 shown in FIGS. 2 and 3 forms part of the assembly shown in FIGS. 5 and 6. FIG. 5 is a side view and shows a large heat radiator 42 having the subassembly 30 attached at one end. The hot side of the Peltier junction device 36 thermally contacts the radiator 42 and, as shown in FIG. 6, the subassembly 30 is secured to the radiator 42 by means of screws 43 which pass through the holes 39 in heat sink 32 shown in FIG. 3. A cable clamp 44 is mounted to the under side of the radiator 42 to hold a sleeve 45 through which electrical wires 46 pass. These wires are connected to the electrical leads 38 of the Peltier junction device and 41 of the temperature sensor 40. The assembly shown in FIGS. 5 and 6 is, in practice, mounted to a printed circuit board (not shown).

Figure 7:
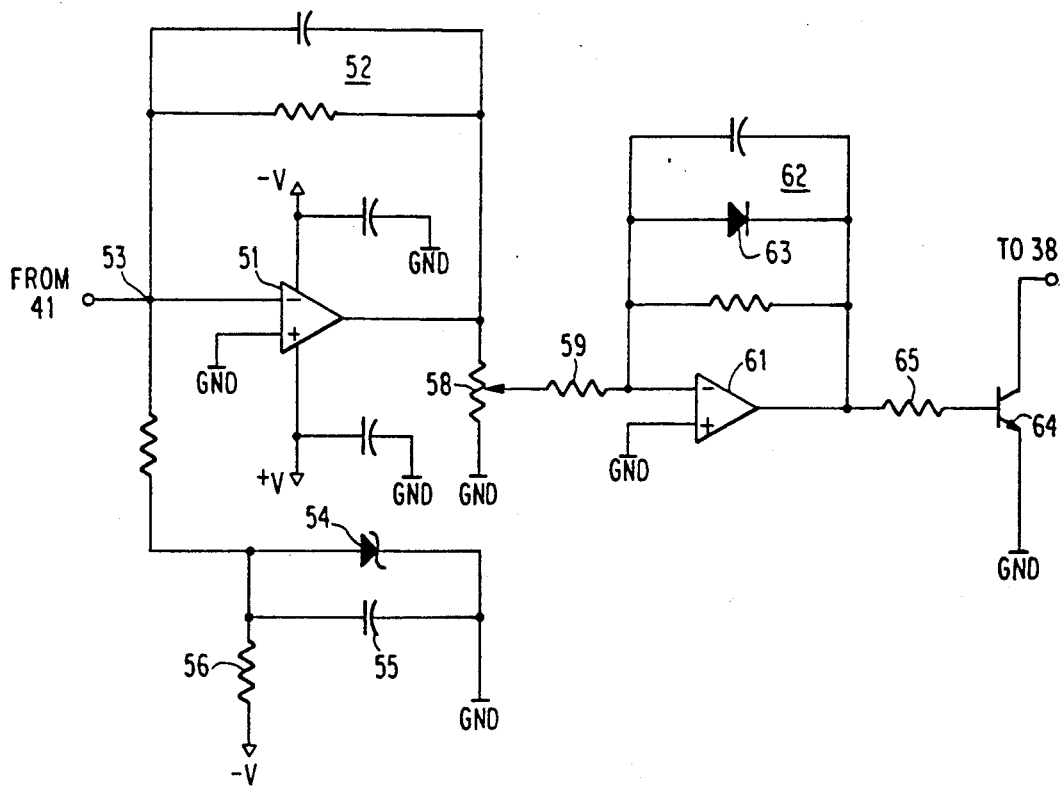
FIG. 7 is a schematic diagram of the temperature feedback control circuit for the Peltier junction cooler.

FIG. 7 shows the temperature control circuit having its input connected to the electrical leads 41 of the temperature sensor 40 and its output connected to the electrical leads 38 of the Peltier junction device 36. More specifically, the temperature sensor leads are connected with one lead connected to the inverting input of operational amplifier 51 and the other lead connected to circuit ground. The non-inverting input to the operational amplifier 51 is also connected to circuit ground. An RC feedback circuit 52 is connected between the output of the amplifier and a summing junction 53 connected to the inverting input of the amplifier. Also connected to the summing junction 53 is a reference voltage source comprising a back-biased Zener diode 54 connected in parallel with a capacitor 55. This circuit is connected between a negative voltage source and circuit ground and via resistor 56 to the summing junction 53.

The output of operational amplifier 51 is taken from the wiper of a potentiometer 58 and fed via resistor 59 to the inverting input of a second operational amplifier 61. The non-inverting input of amplifier 61 is connected to circuit ground, and an RC feedback circuit 62 including a clamping diode 63 is connected between the output of amplifier 61 and its inverting input. The output of amplifier 61 is used to drive the base of a bipolar PNP transistor 64 via a resistor 65. The transistor 64 has its collector and emitter connected to the Peltier junction device electrical leads 38. Thus, the conduction of the transistor 64 controls the current through the Peltier junction device 36 and thereby the cooling of the heat sink 32.

FIG. 8A shows the drift of the amplifier without the temperature control of the invention. It will be observed that the drift is continuous over a period of approximately twenty-seven minutes. Moreover, the range of the drift makes it impossible to measure currents within approximately ±10 fA. In contrast, FIG. 8B is a similar graph for the amplifier with the temperature control of the invention. Drift quickly stabilizes and remains stable, allowing currents to be measured within ±1 fA, or an order of magnitude better.

While the invention has been described in terms of a single preferred embodiment, those skilled in the art will recognize that the invention can be practiced with modification within the spirit and scope of the appended claims.

Having thus described my invention, what I claim as new and desire to secure by Letters Patent is as follows:

1. A solid-state instrumentation operational amplifier for converting currents in the range of 5 to 10 fA to a voltage comprising:
   integrated circuit operational amplifier means formed on a substrate and enclosed within a package;
   temperature sensor means thermally connected to said substrate for generating a signal which is a measure of the temperature of said substrate;
   heat sink means having a recess for receiving said package;
   Peltier junction means having a cold side attached to and in thermal contact with said heat sink means for cooling said heat sink means in response to a control signal; and
   temperature control circuit means having an input connected to said temperature sensor means for generating said control signal to said Peltier junction means to control the temperature of said substrate.

2. The solid-state instrumentation operational amplifier recited in claim 1 further comprising heat radiator means attached to and in thermal contact with a hot side of said Peltier junction means for radiating heat transferred thereto.

3. The solid-state instrumentation operational amplifier recited in claim 1 wherein said substrate is mounted on a ceramic bead in a base of said package, said temperature sensor being attached to the ceramic bead exterior to said package.

4. The solid-state instrumentation operational amplifier recited in claim 1 wherein said temperature sensor is incorporated into said substrate.

5. The solid-state instrumentation operational amplifier recited in claim 1 wherein said temperature control circuit means comprises:
   first means for comparing a signal from said temperature sensor with a reference signal and generating an output control signal; and
   means for applying said control signal to said Peltier junction means.

6. The solid-state instrumentation operational amplifier recited in claim 5 wherein said temperature control circuit means further comprises means for adjusting a controlled temperature level of said substrate.

7. The solid-state instrumentation operational amplifier recited in claim 6 further comprising heat radiator means attached to and in thermal contact with a hot side of said Peltier junction means for radiating heat transferred thereto.

8. The solid-state instrumentation operational amplifier recited in claim 7 wherein said substrate is mounted on a ceramic bead in a base of said package, said temperature sensor being attached to the ceramic bead exterior to said package.

9. The solid-state instrumentation operational amplifier recited in claim 7 wherein said temperature sensor is incorporated into said substrate.

* * * * *